(12) United States Patent
Schuele et al.

(10) Patent No.: US 10,643,870 B2
(45) Date of Patent: May 5, 2020

(54) DIODES OFFERING ASYMMETRIC STABILITY DURING FLUIDIC ASSEMBLY

(71) Applicant: eLux Inc., Vancouver, WA (US)

(72) Inventors: Paul John Schuele, Washougal, WA (US); David Robert Heine, Horseheads, NY (US); Mark Albert Crowder, Portland, OR (US); Sean Mathew Garner, Elmira, NY (US); Changqing Zhan, Vancouver, WA (US); Avinash Tukaram Shinde, Pune (IN); Kenji Alexander Sasaki, West Linn, OR (US); Kurt Michael Ulmer, Vancouver, WA (US)

(73) Assignee: eLux Inc., Vancouver, WA (US)

( * ) Notice: Subject to any disclaimer, the term of this patent is extended or adjusted under 35 U.S.C. 154(b) by 0 days.

(21) Appl. No.: 16/420,097

(22) Filed: May 22, 2019

(65) Prior Publication Data

US 2019/0273006 A1     Sep. 5, 2019

Related U.S. Application Data

(63) Continuation of application No. 15/859,673, filed on Jan. 1, 2018, now Pat. No. 10,347,513, which is a
(Continued)

(51) Int. Cl.
*H01L 21/67* (2006.01)
*H01L 29/06* (2006.01)
(Continued)

(52) U.S. Cl.
CPC .. *H01L 21/67121* (2013.01); *H01L 21/67333* (2013.01); *H01L 24/95* (2013.01); *H01L 29/0657* (2013.01); *H01L 33/0095* (2013.01); *H01L 25/0753* (2013.01); *H01L 2224/95085* (2013.01)

(58) Field of Classification Search
CPC ......... H01L 21/67121; H01L 21/67333; H01L 24/95; H01L 29/0657; H01L 33/0095; H01L 25/0753
See application file for complete search history.

(56) References Cited

U.S. PATENT DOCUMENTS 5,355,577 A   10/1994  Cohn
5,545,291 A   8/1996   Smith et al.
(Continued)

FOREIGN PATENT DOCUMENTS

JP   2006-278511   10/2006
JP   11-186590    7/2007
(Continued)

OTHER PUBLICATIONS

Morris et al "Self-Assembly for Microscale and Nanoscale Packaging:Steps Toward Self-Packaging", IEEE Trans. Adv. Packag. 2005, 28, 600-611.
(Continued)

*Primary Examiner* — Yosef Gebreyesus
(74) *Attorney, Agent, or Firm* — HDC IP Law LLP (57) ABSTRACT

Embodiments are related to systems and methods for fluidic assembly, and more particularly to systems and methods for assuring deposition of elements in relation to a substrate.

20 Claims, 7 Drawing Sheets

Related U.S. Application Data continuation of application No. 15/190,813, filed on Jun. 23, 2016, now Pat. No. 9,892,944.

(51) Int. Cl.
*H01L 21/673* (2006.01)
*H01L 23/00* (2006.01)
*H01L 33/00* (2010.01)
*H01L 25/075* (2006.01)

(56) References Cited

U.S. PATENT DOCUMENTS

| | | | |
|---|---|---|---|
| 5,696,389 | A | 10/1997 | Ishikawa et al. |
| 5,904,545 | A | 5/1999 | Smith et al. |
| 6,527,964 | B1 | 3/2003 | Smith et al. |
| 6,566,744 | B2 | 5/2003 | Gengel |
| 6,623,579 | B1 | 9/2003 | Smith et al. |
| 6,771,019 | B1 | 8/2004 | Wu et al. |
| 6,821,805 | B1 | 11/2004 | Nakamura et al. |
| 6,927,382 | B2 | 8/2005 | King et al. |
| 7,528,422 | B2 | 5/2009 | Murphy |
| 7,589,355 | B2 | 9/2009 | Tomoda et al. |
| 7,687,277 | B2 | 3/2010 | Sharma et al. |
| 7,727,788 | B2 | 6/2010 | Han et al. |
| 7,784,474 | B2 | 8/2010 | Kondos |
| 7,928,655 | B2 | 4/2011 | Lin et al. |
| 7,931,063 | B2 | 4/2011 | Craig et al. |
| 8,076,178 | B2 | 11/2011 | Krishnamoorthy et al. |
| 8,318,595 | B2 | 11/2012 | Morris et al. |
| 8,426,227 | B1 | 4/2013 | Bibl et al. |
| 8,516,683 | B2 | 8/2013 | Crendelle et al. |
| 8,552,436 | B2 | 10/2013 | Bibl et al. |
| 8,629,465 | B2 | 1/2014 | Yu et al. |
| 8,648,328 | B2 | 2/2014 | Crowder et al. |
| 8,685,774 | B2 | 4/2014 | Crowder et al. |
| 2003/0057444 | A1 | 3/2003 | Niki et al. |
| 2005/0196589 | A1* | 9/2005 | Watanabe ............... H01L 24/95 428/172 |
| 2007/0031992 | A1 | 2/2007 | Schatz |
| 2007/0120463 | A1 | 5/2007 | Hayashi et al. |
| 2007/0224713 | A1 | 9/2007 | Han et al. |
| 2008/0036038 | A1 | 2/2008 | Hersee et al. |
| 2010/0163895 | A1 | 7/2010 | Horie |
| 2010/0276664 | A1 | 11/2010 | Hersee |
| 2011/0031516 | A1 | 2/2011 | Basin et al. |
| 2012/0032220 | A1 | 2/2012 | Cannon et al. |
| 2012/0178195 | A1 | 7/2012 | Ray et al. |
| 2013/0161584 | A1 | 6/2013 | Crowder et al. |
| 2013/0161643 | A1 | 6/2013 | Crowder et al. |
| 2014/0008696 | A1 | 1/2014 | Kim et al. |
| 2014/0077158 | A1 | 3/2014 | Crowder et al. |
| 2014/0355931 | A1 | 12/2014 | Tummala et al. |
| 2015/0060402 | A1 | 5/2015 | Moslehi et al. |
| 2015/0140721 | A1 | 5/2015 | Moslehi et al. |
| 2015/0155445 | A1 | 6/2015 | Zhan et al. |
| 2015/0166396 | A1 | 6/2015 | Marjanovic et al. |
| 2015/0187740 | A1 | 7/2015 | McGroddy et al. |
| 2015/0214430 | A1 | 7/2015 | Zhan et al. |

FOREIGN PATENT DOCUMENTS

| | | |
|---|---|---|
| JP | 2007-294566 | 11/2007 |
| KR | 10-2007-0096212 | 10/2007 |
| KR | 10-2012-0124660 | 11/2012 |

OTHER PUBLICATIONS

Boncheva "Millimeter-scale self-assembley and its applications" Pure Appl. chem, 75, No. 5, pp. 621-630, 2003.

Mastrangeli et al "Self Assembly from Mili-to nanoscales, methods and applications" J. Jicromech. Microeng. 2009, 19, 083001 (37 pp).

Yeh "Fluidic Self-Assembly for the Integration of GaAs Light-emitting Diodes on Si Substrates" IEEE Photonics Technol. Eltt., 1994 ,6, 706-708.

Tien "Microfarication through elecrostatic self-assembly" Langmuir, 1997, 13, 5349-5355.

Snyder et al "Fluidic Self-Assembly of Semiconductor Devices: a Promising New Method of Mass-Procucing Flexible Circuirty" Jpn. J. appl. Phys, 2002, 41,4366-4369.

Chung "Programmable Reconfiguable Self-Assembly: Parallel Heterogenous Integration of Chip-Scale Components on Planar and NonPlanar Surfaces" J. Microelectronmech. Syst. 2006.

Stauth "Self-Assembled Single-Crystal Silicon Circuits on Platic" Proc. Natl. Acad. Sci, USA 2006, 103, 13922-13927.

Saeedi et al "Self-assembled Single-Digit Micro-Display on Plastic" Proc. of SPIE, 2008, 6885.

Park "Orientation-Specific Self-Assembly at air-Water Interface Using Magnetic Field" Transducers 11, Beijing, China, Jun. 5-9, 2011.

Tkachenko "Evaluation of Directed Self-Assembly Process for LED Assembly on Flexible Substrates" Electronic Components & Technology Conference (ECTC), 2013 IEEE 63rd.

Nakagawa "Controlled Deposition of Silicon Nanowires on Chemically Patterend Substrate by Capillary Force Susing a Blade-Coating Method" J. Phys. Chem, C, 2008, 112, 5390-5396.

Arase, "Interfacial-Energy-Controlled Deposition Technique of Microstructures Using Blade Coating" J. Phy. Chem. B. 2009,113, 15278-15283.

Nakagawa "Interfacial-Force-Controlled Placing Technique of Microstructures of sub-to one hundred micrometer size using blade coating" Jpn. J. Appl. Phy, 2011.

Arase, "Fluidic Self-Assembly of Microctructures Using a Blade-Coating Technique" Jpn J. Appl. Phys, 2012.

Nordquist et al "An eloctro-Fluidic Assembly Technique for Integration of III-V Devices onto Silicon" IEEE Internation Symposium on Compound Semiconductore, Proc. 2000.

Khare et al "Bia Hole Formation in Semi-Insulatin InP Using Wet Photoelectrochemical Etching" Indium Phosphide and Related Materials, 1993 Conference Proceedings.

Brusberg et al "Thin Glass Based Packaging Technologies for Optoelectronic Modules" Electronic Components and Technology Conference, 2009.

Kim et al "Large Scale Self-Assembly of Chrystalline Semiconductor Microcomponents onto Plastic Substrates Via Microfluidic Traps" 4th IEEE Conf. On Automation (2008).

Xiao et al "Fluidic Assisted Thin-Film Device Heterogenous Integration:Surface Tension as Driving Force and Magnetic as Guiding Force" Science Direct (2015).

Yeh et al "New Fabrication Technique for the Integration of Large ARea Optoelectronic Display Panels" OSA/CLEO (1994).

Varna et al "Fluidic Self-Asserrlbly of Silicon Microstructures" University of CA Berkley (1995).

Talghader Integration of LEDs and VCSELs Using Fluidic Self-Assembly (SPIE vol. 3256, p. 86).

Zheng et al, "Self Assembly Process to Integrate and Connect Semiconductor Dies on Surfaces with Single-angular Orientation and Contract Pad Registration" Adv. Mater. (2006).

Park et al "A First Implementation fo an Automated Reel-to-Reel Fluidic Self Assembly Machine" Adv. Mater. vol. 26, No. 34, 9/14 Avalable Online.

Park et al "Printed Assemblies of Inorganic Light-Emitting Diodes for Deformable and Semitransparent Displays" Aug. 2009 www.Sciencemag.org.

Jacobs et al "Fabircation of a Cylindrical Display by Patterend Assembly" Science, vol. 296, Apr. 2002.

Chung et al "Guided and Fluidic Self-Assembly of Microstructures Using Railed Microfluidic Channels" Pub. online Jun. 15, 2008.

* cited by examiner

Fig. 9

DIODES OFFERING ASYMMETRIC STABILITY DURING FLUIDIC ASSEMBLY

CROSS REFERENCE TO RELATED APPLICATIONS

This application is a Continuation of U.S. patent application Ser. No. 15/859,673 entitled "Diodes Offering Asymmetric Stability During Fluidic Assembly" and filed Jan. 1, 2018 by Schuele et al., which in turn is a continuation of U.S. Pat. No. 9,892,944 entitled "Diodes Offering Asymmetric Stability During Fluidic Assembly" and filed Jun. 23, 2016 by Schuele et al. The entirety of the aforementioned application is incorporated herein by reference for all purposes.

FIELD OF THE INVENTION

Embodiments are related to systems and methods for fluidic assembly, and more particularly to systems and methods for assuring deposition of elements in relation to a substrate.

BACKGROUND

LED displays, LED display components, and arrayed LED devices include a large number of diodes formed or placed at defined locations across the surface of the display or device. Forming or placing such a large number of diodes often results in low throughput or in a number of defects which reduce the yield of a display or device manufacturing process. Some approaches to increasing throughput and yield include adding additional diodes per pixel to provide enough redundancy to ensure that at least a sufficient number of diodes per pixel are properly formed. This type of approach offers enhanced yield, but without adding a large number of redundant diodes per pixel, display yields are often still lower than desired. Any yield less than one hundred percent within a display is costly both in an impact on profits and an impact on manufacturing throughput.

Hence, for at least the aforementioned reasons, there exists a need in the art for advanced systems and methods for manufacturing LED displays, LED display components, and LED devices.

SUMMARY

Embodiments are related to systems and methods for fluidic assembly, and more particularly to systems and methods for assuring deposition of elements in relation to a substrate.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Embodiments are related to systems and methods for fluidic assembly, and more particularly to systems and methods for assuring deposition of elements in relation to a substrate.

Various embodiments of the present inventions provide fluidic assembly systems that include: a substrate and a suspension. The substrate includes a plurality of wells, and the suspension includes a carrier liquid and a plurality of post enhanced diodes each including a post extending from a top surface of a diode structure. In some instances of the aforementioned embodiments, the systems further include a suspension movement device operable to move the suspension over the substrate such that a portion of the plurality of post enhanced diodes deposit in respective ones of the plurality of wells.

In various instances of the aforementioned embodiments, the diode structure of the post enhanced diodes includes: the top surface formed at least in part of a first electrically conductive material; a planar bottom surface formed at least in part of a second electrically conductive material; a first electrical contact configured to conduct charge to the first electrically conductive material; and a second electrical contact configured to conduct charge to the second electrically conductive material. In one or more instances of the aforementioned embodiments, each of the plurality of wells includes a through hole via extending through the substrate from the bottom of the respective well. In some such cases, a width of a surface of the post substantially parallel to the top surface of the diode structure is greater than a width of the through hole via. In other such cases, the through hole via is off center from a substantially circular shaped bottom of the respective well.

In some instances of the aforementioned embodiments, a maximum width of the bottom surface is less than a maximum width of each of the plurality of wells. In various instances of the aforementioned embodiments, an electrical contact is formed on an interior surface of each of the plurality of wells. In some instances of the aforementioned embodiments, an orientation of each of the plurality of post enhanced diodes where the post extends away from the substrate is a non-inverted orientation, wherein an orientation of each of the plurality of post enhanced diodes where the post extends toward the substrate is an inverted orientation, and wherein one of the plurality of post enhanced diodes deposited in a respective well is more mechanically stable in the non-inverted orientation than in the inverted orientation. In one or more instances of the aforementioned embodiments, an orientation of each of the plurality of post enhanced diodes where the post extends away from the substrate is a non-inverted orientation, an orientation of each of the plurality of post enhanced diodes where the post extends toward the substrate is an inverted orientation, and an orientation of one of the plurality of post enhanced diodes in contact with a surface of the substrate is more mechanically stable in the non-inverted orientation than in the inverted orientation.

In various instances of the aforementioned embodiments, an orientation of each of the plurality of post enhanced diodes where the post extends away from the substrate is a non-inverted orientation, an orientation of each of the plurality of post enhanced diodes where the post extends toward the substrate is an inverted orientation, and the substrate further includes at least one groove configured such that an orientation of one of the plurality of post enhanced diodes traversing the groove is more mechanically stable in the non-inverted orientation than in the inverted orientation. In some such instances, the groove extends into the substrate with a leading edge exhibiting a slope greater than a trailing edge, and whereupon moving the suspension over the substrate one of the post enhanced diodes crosses the trailing edge before crossing the leading edge. In various such instances, a depth of the groove into the substrate is less than a distance from an edge of the top surface of the diode structure to an edge of the post. In one or more such instances, a width of the groove at a surface of the substrate is less than a distance from an edge of the top surface of the diode structure to an edge of the post.

Other embodiments of the present inventions provide post enhanced diodes. Such post enhanced diodes include: a planar top surface formed at least in part of a first electrically conductive material; a planar bottom surface formed at least in part of a second electrically conductive material; a post extending from the top surface; a first electrical contact configured to conduct charge to the first electrically conductive material; and a second electrical contact configured to conduct charge to the second electrically conductive material.

In some instances of the aforementioned embodiments, the top surface exhibits a first maximum width, a surface of the post that is substantially parallel to the top surface exhibits a second maximum width, and the first maximum width is at least two times the second maximum width. In various instances of the aforementioned embodiments, the height of the post is measured from the top surface to the surface of the post that is substantially parallel to the top surface and the thickness of the diode structure is measured from the top surface and the bottom surface. In some cases, the thickness-to-height ratio is in a range of 1:0.6 to 1:4. In one or more instances of the aforementioned embodiments, the top surface exhibits a maximum width and the thickness of the diode structure is measured from the top surface and the bottom surface. In some cases, the maximum width-to-thickness aspect ratio is in a range of 5:1 to 50:1.

In some instances of the aforementioned embodiments, the post is the first electrical contact. In various instances of the aforementioned embodiments, the post is formed of an insulator material. In some cases, the top surface is circular in shape, while in other instances the top surface is polygonal in shape. In particular cases, the top surface is hexagonal in shape with a width of each facet of the hexagon sufficiently small to allow the top surface to fit within a given well. In various instances of the aforementioned embodiments, a surface of the post that is substantially parallel to the top surface has a shape circular in shape, while in other instances it is polygonal in shape. In one or more instances of the aforementioned embodiments, the post is formed of a third conductive material which, in some cases, is the same as the first conductive material. In some cases, the first conductive material is a p-doped semiconductor material, and the second conductive material is an n-doped semiconductor material. In some cases the post can have a rounded top surface or surface with complex curvature, and in other cases it can have a substantially flat top surface. In other cases, multiple posts may exist on the diode top surface. The posts can be center on the diode surface or they can be off-set.

Yet other embodiments provide substrates for fluidic assembly. Such substrates include: a plurality of wells extending from a top surface of the substrate, where each of the plurality of wells is configured to accept a post enhanced diode; and at least one groove extending into the top surface of the substrate and configured such that an orientation of the post enhanced diodes traversing the groove is more mechanically stable in a non-inverted orientation than in an inverted orientation. The post enhanced diode includes a post extending from a top surface of a diode structure. When the post enhanced diode is in a non-inverted orientation, the post extends away from the top surface of the substrate. When the post enhanced diode is in an inverted orientation, the post extends toward the top surface of the substrate. In some instances of the aforementioned embodiments, a depth of the groove into the substrate is less than a distance from an edge of the top surface of the diode structure to an edge of the post. In various instances of the aforementioned embodiments, a width of the groove at a surface of the substrate is less than a distance from an edge of the top surface of the diode structure to an edge of the post.

Figure 1:
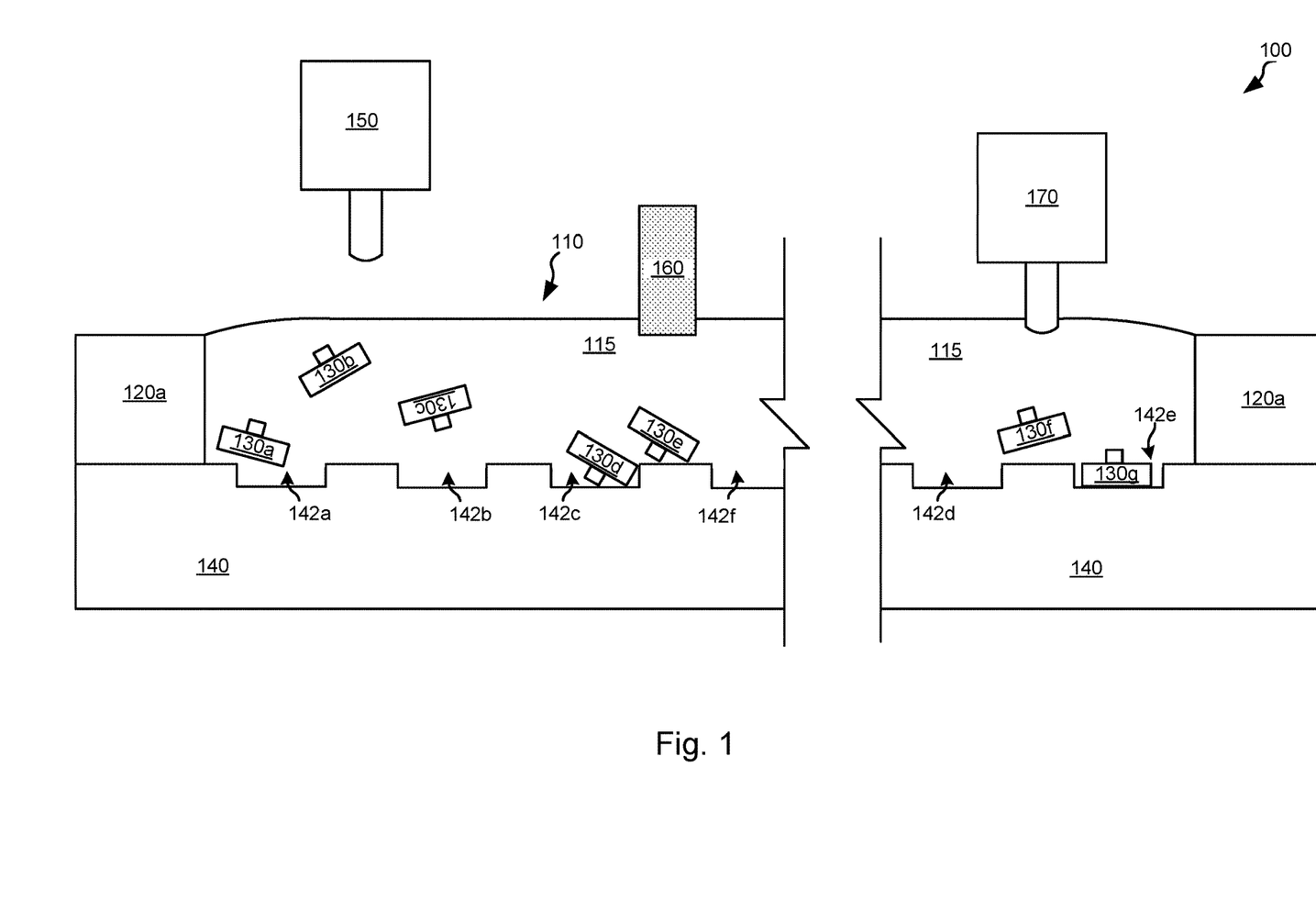
FIG. 1 depicts a fluidic assembly system capable of moving a suspension composed of a carrier liquid and a plurality of post enhanced diodes relative to the surface of a substrate in accordance with one or more embodiments of the present inventions.

Turning to FIG. 1, a fluidic assembly system 100 capable of moving a suspension 110 composed of a carrier liquid 115 and a plurality of post enhanced diodes 130 relative to the surface of a substrate 140 is shown in accordance with one or more embodiments of the present inventions. In some embodiments, substrate 140 is formed of a polymer material laminated to the surface of a glass substrate. In particular embodiments, wells 142 are etched or otherwise formed in the laminate layer. As used herein, the term "well" is used in its broadest sense to mean any surface feature into which a post enhanced diode may be deposited. In other embodiments, the substrate is made of glass with wells 142 directly formed into the glass. Wells 142 may have flat and vertical surfaces as shown, or they may have bottoms and sides with complex curvatures. Based upon the disclosure provided herein, one of ordinary skill in the art will recognize a variety of materials, processes, and/or structures that may be used to form substrate 140. For example, substrate 140 can be formed of any material or composition compatible with fluidic device processing. This can include, but is not limited to, glass, glass ceramic, ceramic, polymer, metal, or other organic or inorganic materials. As examples, wells 142 can be defined in a single material forming a surface feature layer when applied to the surface of a base glass sheet. It is also possible for patterned conductor layers to exist between wells 142 formed in such a surface feature layer and the base glass layer. Substrate 140 can also be made of multiple layers or combinations of these materials. Substrate 140 may be a flat, curved, rigid, or flexible structure. In some cases, substrate 140 may end up being the final device substrate or it may only serve as an assembly substrate to position post enhanced diodes 130. In the case of an assembly substrate, post enhanced diodes 130 would then be transferred to the final device substrate in subsequent steps.

In some embodiments, carrier liquid 115 is isopropanol. Based upon the disclosure provided herein, one of ordinary skill in the art will recognize a variety of liquids, gasses, and/or liquid and gas combinations that may be used as the carrier liquid. It should be noted that various analysis provided herein is based upon flow in a single, continuous direction or in other cases a relatively simple back-forth motion, but that the flow may be more complex where both the direction and magnitude of fluid velocity can vary over time.

As shown in FIG. 1, post enhanced diodes 130 each include a relatively large diode structure and a smaller post extending from a top surface of the diode structure, and wells 142 in substrate 140 are each capable of receiving a given post enhanced diode 130 in a non-inverted orientation. As used herein, the phrase "post enhanced diode" is used broadly to mean any device with a post extending from a surface of either an anode or cathode of a diode structure such that at least a portion of an outer edge of the post is set back from an edge of the diode structure. As used herein the phrase "non-inverted orientation" is used in its broadest sense to mean any orientation of a post enhanced diode 130 with the post extending generally away from the top surface of substrate 140 (i.e., away from the bottom of wells 142); and as used herein the phrase "inverted orientation" is used in its broadest sense to mean any orientation of a post enhanced diode 130 with the post extending generally toward the top surface of substrate 140 (i.e., toward from the bottom of wells 142). Using these definitions, post enhanced diodes 130a, 130b, 130f, and 130g are each in a non-inverted orientation; and post enhanced diodes 130c, 130d, and 130e are each in an inverted orientation. The diode structure and post of post enhanced diodes 130 are discussed in greater detail below in relation to FIGS. 2a-2e. It should be noted that in some cases the diode structure including an anode on one side and a cathode on the other can be referred to as asymmetric due to the different materials on each side of the diode structure, however, the use of the term "asymmetric" in relation to a diode herein refers to any asymmetry of forces generated by liquid movement around a post enhanced diode between an inverted orientation and a non-inverted orientation due to a post extending from the diode structure. In some cases, the depth of wells 142 is substantially equal to the height of the diode structure of each of the post enhanced diodes 130, and the inlet opening of wells 142 is greater that the width of the diode structure of each of the post enhanced diodes 130 such that only one post enhanced diode 130 deposits into any given well 142. It should be noted that while embodiments discuss post enhanced diodes that include a single post extending from a diode structure, that various embodiments provide post enhanced diodes that each include two or more posts each extending from the same diode structure.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that post enhanced diodes 130 move relative to the surface of substrate 140. As post enhanced diodes 130 move relative to the surface of substrate 140 they deposit into wells 142 in either a non-inverted orientation or an inverted orientation. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

When deposited in the inverted orientation (e.g., post enhanced diode 130d), the movement generated by suspension movement device 160 generates force likely to dislocate an inverted post enhanced diode 130 from a given well 142. In contrast, when deposited in the non-inverted orientation (e.g., post enhanced diode 130g), the force on the deposited, non-inverted post enhanced diode 130 caused by suspension movement device 160 is unlikely to dislocate the post enhanced diode from a given well 142. In some embodiments, the likelihood of dislocating an inverted post enhanced diode 130 from a well 142 is much greater than the likelihood of dislocating a non-inverted post enhanced diode 130 from a well 142. In some embodiments the moment of force required to dislocate an inverted post enhanced diode 130 from a well 142 is between $0.01 \times 10^{-14}$ N-m and $1.0 \times 10^{-14}$ N-m depending upon the width to height ratio of the post and the diameter of the diode structure (where a positive value of the moment of force indicates the diode structure of a post enhanced diode 130 is being forced to rotate about a point of rotation); and the moment of force required to dislocate a non-inverted post enhanced diode 130 from a well 142 is a negative value (where a negative value of the moment of force indicates the diode structure of a post enhanced diode 130 is being pushed down on the surface of substrate 140) for the same width to height ratio of the post and thickness of the diode structure making any displacement unlikely. As used herein, a post enhanced diode is considered "likely to dislocate" where the moment of force is a positive value, and is considered "unlikely to dislocate" where the moment of force is a negative value.

Similarly, when moving across the surface of substrate 140 in the inverted orientation (e.g., post enhanced diode 130e), the movement generated by suspension movement device 160 generates a force likely to flip an inverted post enhanced diode 130. In contrast, when moving across the surface of substrate 140 in the non-inverted orientation (e.g., post enhanced diode 130o, the force on the non-inverted post enhanced diode 130 caused by suspension movement device 160 is less likely to flip the post enhanced diode. In some embodiments, the likelihood of flipping an inverted post enhanced diode 130 moving near the surface of substrate 140 is greater than the likelihood of flipping a non-inverted post enhanced diode 130 moving similarly near the surface of substrate 140 as the moment of force for the inverted post enhanced diode 130 is greater than the moment of force for the non-inverted post enhanced diode 130.

A capture device 170 includes an inlet extending into suspension 110 and capable of recovering a portion of suspension 110 including a portion of carrier liquid 115 and non-deposited post enhanced diodes 130, and returning the recovered material for reuse. In some embodiments, capture device 170 is a pump. More detail regarding the interaction of post enhanced diodes 130 with substrate 140 and wells 142 is provided in relation to FIGS. 3-5 below.

Figure 2A:
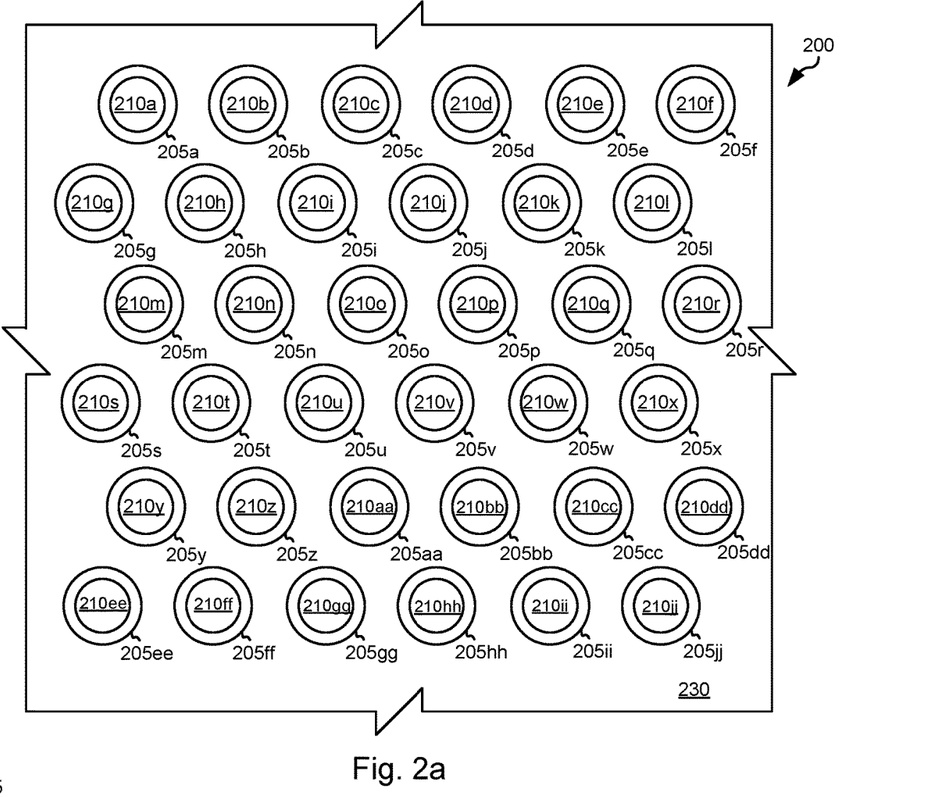
FIGS. 2a-2e show a portion of a display including a substrate having a number of wells each filled with a respective post enhanced diode in accordance with embodiments of the present inventions.

Turning to FIG. 2a, a top view 200 of a substrate portion 230 is shown including a number of wells 205 into which post enhanced diodes 210 have been successfully deposited. Each of post enhanced diodes 210 of FIG. 2a are represented in a top view 235 of FIG. 2b, a cross sectional view 250 of FIG. 2c, and a circuit symbol 280 of a post enhanced diode 210 operating as an LED. Post enhanced diodes 210 include one or more features that enable the relative flow of a carrier liquid about post enhanced diodes 210 to create a net moment of force for increasing a likelihood of flipping post enhanced diodes 210 from a first orientation to a second orientation, with a dissimilar (i.e., asymmetric) likelihood of flipping post enhanced diodes 210 from the second orientation to the first orientation. These features may include sidewall angles, surface structures such as posts, or the general shape of the post enhanced diodes 210. Notably, the aforementioned structures and shapes of the post enhanced diodes 210 that encourage asymmetric re-orientation may or may not be present in a final display incorporating post enhanced diodes 210.

Figure 2B:
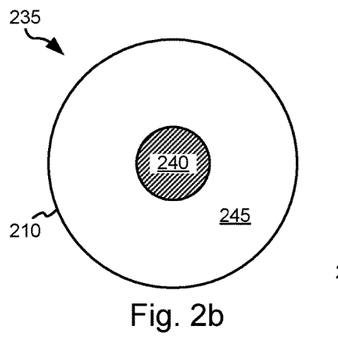
Figure 2C:
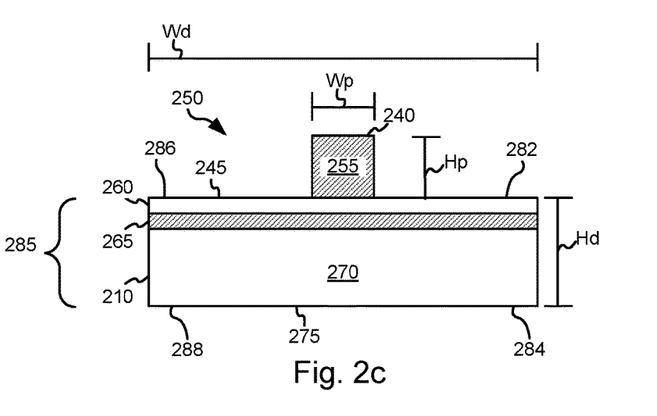
Figure 2D:
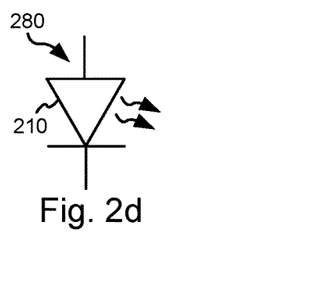

As shown in FIGS. 2b-2c, post enhanced diode 210 includes a planar top surface 245 of an electrically conductive material 260 (shown as an un-patterned region). As used herein, the term "planar" is used in its broadest sense to mean two dimensional with exception of defects or process related variance standard in semiconductor manufacturing processes. In some embodiments, electrically conductive material 260 is p-doped Gallium Nitride (GaN). A post 255 (show as a hatched pattern region) extending from top surface 245 is also shown. A top surface 240 of post 255 is also shown. In some embodiments, post 255 is formed of electrically conductive material 260 (i.e., a homogeneous post). In other embodiments, post 255 is formed of a material other than electrically conductive material 260 (i.e., a heterogeneous post). In some cases, a heterogeneous post is formed at least in part of an insulating layer such as $SiO_2$, and in other cases a heterogeneous post is formed of a conductive material such as a metal compatible with deposition on electrically conductive material 260. It should be noted that while post 255 is shown as substantially centered on top surface 245, in other embodiments post 255 may be offset from a center position at any location from a center point of top surface 245 to a radial distance from the center point such that a portion, but not all of the edges, of post 255 is coextensive with an edge of a diode structure 285. In some cases the post can have a rounded top surface or surface with complex curvature, and in other cases it can have a substantially flat top surface. In other cases, multiple posts may exist on the diode top surface.

Various approaches may be used for forming post 255 on diode structure 285. For example, fabricating a homogeneous post may include etching the top surface of a thick layer of electrically conductive material 260 to yield the combination of both post 255 and the layer of electrically conductive material 260 shown in cross sectional view 250; or by forming the layer of electrically conductive material 260 followed by selective epitaxial growth using the same material to form post 255. As other examples, fabricating a heterogeneous post may include etching the post from a film that is deposited onto top surface 245 of diode structure 285, or by forming a post with a different material through plating or a templated growth process on top of top surface 245 of diode structure 285. This latter approach permits the use of any material for the post (e.g., dielectrics, metals, etc.). In some cases, photolithography of a photo resist may be used in relation to the aforementioned plating or template growth.

Top surface 245 includes one or more electrical contacts 282, 286 that conduct charge from a signal source (not shown) to electrically conductive material 260. In some embodiments, electrical contacts 282, 286 are formed of a metal deposited onto the layer of electrically conductive material 260. In other embodiments, electrical contacts 282, 286 are an exposed area of top surface 245 to which a signal source (not shown) can contact electrically conductive material 260. In some embodiments where post 255 is formed of a conductive material it operates as a post. In one particular embodiment where post 255 is formed of electrically conductive material 260, an exposed area of top surface 240 to which a signal source (not shown) can contact electrically conductive material 260 operates as an electrical contact.

The layer of electrically conductive material 260 is disposed on top of a multiple quantum well (MQW) 265 (shown as a hatched pattern region), which in turn is disposed on top of a layer of an electrically conductive material 270 (shown as an un-patterned region). In some embodiments, electrically conductive material 270 is n-doped Gallium Nitride (GaN). MQW 265 may be formed of any material compatible with both electrically conductive material 260 and electrically conductive material 270, and which when sandwiched between electrically conductive material 260 and electrically conductive material 270 is capable of operating as a light emitting diode (LED). Together, the layer of electrically conductive material 260, MQW 265, and the layer of electrically conductive material 270 form a diode structure of post enhanced diodes 210. Based upon the disclosure provided herein, one of ordinary skill in the art will recognize a variety of materials and material combinations that may be used in forming diode structure 285 of a given post enhanced diode 210. As different post enhanced diodes 210 are intended to emit light of different wavelengths (e.g., red, green, blue), the construction and/or materials for different instances of post enhanced diodes 210 will vary to achieve a desired color distribution.

The layer of electrically conductive material 270 includes a planar bottom surface 275. Bottom surface 275 includes one or more electrical contacts 284, 288 that conduct charge from a signal source (not shown) to electrically conductive material 270. In some embodiments, electrical contacts 284, 284 are formed of a metal deposited onto the layer of electrically conductive material 270. In other embodiments, electrical contacts 284, 288 are an exposed area of bottom surface 275 to which a signal source (not shown) can contact electrically conductive material 270. In particular cases, electrical contacts 284, 288 are two sides of the same contact extending as a concentric circle of exposed electrically conductive material 270 around the perimeter of bottom surface 275.

Post 255 has a width (Wp) and a height (Hp), and diode structure 285 has a width (Wd) and a height (Hd). As more fully discussed below in relation to FIG. 2e, the sides of post 255 and diode structure 285 in some cases are not perfectly vertical and may vary. In such a case, the aforementioned width and height characteristics of post 255 and diode structure 285 are considered to be: the maximum width where the width varies as a function of height, and the maximum height where the height varies as a function of width. In some embodiments, the width:height ratio of diode structure 285 (i.e., Wd:Hd) is between 5:1 and 50:1. In some particular embodiments, the width:height ratio of diode structure 285 (i.e., Wd:Hd) is between 5:1 and 30:1. In some embodiments, the width:height ratio of post 255 (i.e., Wp:Hp) is between 2:1 and 5:1. In various embodiments, the height of diode structure 285 (i.e., Hd) is between 4 µm and 7 µm, and the height of post 255 (i.e., Hp) is between 2 µm and 7 µm, in part depending upon the desired ratio of Hd to Hp.

The dimensions of post 255 can affect the stability of an inverted post enhanced diode 210. In particular, if the post is too small, post enhanced diode 210 will not be as likely to flip into a non-inverted orientation. Numerical modeling of the fluidic process shows that, for a 50-µm-diameter (Wd) diode structure that is 5 µm thick (Hd) exposed to a flow velocity of a carrier liquid of 4.6 mm/s, a post with dimensions of 10 µm×5 µm (Wp×Hp) will flip the disk to the non-inverted orientation. Models with varying post dimensions on a 50-µm-diameter (Wd) disk diode structure that are captured in a 3 µm deep well have shown that small posts (e.g., with a height (Hp) less than or equal to 4 µm) exposed to a similar flow velocity as above, have little influence on the orientation, but a 5-µm high (Hp) post is sufficient to cause an inverted post enhanced diode 210 to flip while a non-inverted post enhanced diode 210 will remain in a non-inverted orientation. Experimental data has demonstrated that the modeling revealing the aforementioned dimensions is reliable, and that a post with dimensions of 12 µm×3 µm (Wp×Hp) is able to influence the orientation of fluidically-aligned disks, with a yield of over 99.7% of disks (out of 150 disks) having a desired non-inverted orientation. The following table shows additional modeling data for the net moment of force for inverted post enhanced diodes 210 having different diode structure widths (Wd) and ratios of post height to width (Hp×Wp):

|  | Wp × Hp = 10 × 5 | Wp × Hp = 15 × 5 | Wp × Hp = 20 × 5 | Wp × Hp = 20 × 7 |
|---|---|---|---|---|
| Wd = 40 µm | +0.29 × $10^{-14}$ N-m | — | — | — |
| Wd = 50 µm | +0.52 × $10^{-14}$ N-m | — | — | — |
| Wd = 70 µm | −0.29 × $10^{-14}$ N-m | −0.11 × $10^{-14}$ N-m | +0.07 × $10^{-14}$ N-m | — |
| Wd = 90 µm | −1.57 × $10^{-14}$ N-m | −1.33 × $10^{-14}$ N-m | −1.13 × $10^{-14}$ N-m | +0.09 × $10^{-14}$ N-m |

Figure 2E:
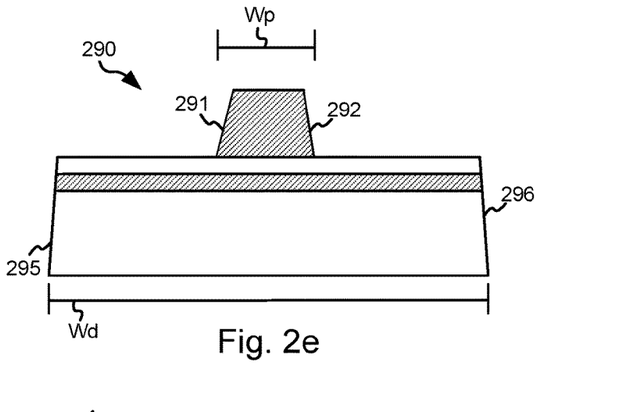

Turning to FIG. 2e, a cross sectional view 290 of another embodiment of a post enhanced diode 210 where side walls 291, 292 of post 255 and sidewalls 295, 296 of diode structure 285 each exhibit a tapered slope compared with the vertical slope shown in cross sectional view 250 of FIG. 2c. As discussed above, where the sidewalls are tapered (i.e., vary as a function of height), the width of the post (Wp) is the maximum width thereof, and the width of diode structure 285 (Wd) is the maximum width thereof as shown in cross sectional view 290. The taper exhibited by the sidewalls will vary dependent upon the processes and materials used for constructing post enhanced diodes 130 as is known in the art. Similar tapering may occur on the sides of wells 205. It should be noted that addition of the post to diode structure 285 results an asymmetry of forces generated by liquid movement around a plate diode between an inverted orientation and a non-inverted orientation. As such, the post need not be a perfectly vertical structure, but rather may be any structure sufficient to result in a net positive moment of force when post enhanced diode 210 is in an inverted orientation, and a substantially lower moment of force when post enhanced diode 210 is in a non-inverted orientation such that post enhanced diodes 210 will prefer a non-inverted orientation. In some cases, the depth of wells 205 is substantially equal to the height of diode structure 285 of each of the post enhanced diodes 210, and the inlet opening of wells 205 is greater that the width of diode structure 285 of each of the post enhanced diodes 210 such that only one post enhanced diode 210 deposits into any given well 205.

Once post enhanced diodes 210 are deposited in wells 205 with post 255 extending away from substrate portion 230, one or more electrical contacts in wells 205 are connected to one or more electrical contacts on bottom surface 275 of post enhanced diodes 210, and one or more processing steps are performed to electrically connect one or more electrical contacts on top surface 245 of post enhanced diodes 210 to controllable signals. Upon completion of such processing, post enhanced diodes 210 can be individually controlled causing a display including substrate portion 230 and post enhanced diodes 210 to display a desired image. Post enhanced diodes 210 as discussed herein may be used, among other things, to fabricate both direct emission displays and locally-addressed backlight units.

Figure 3A:
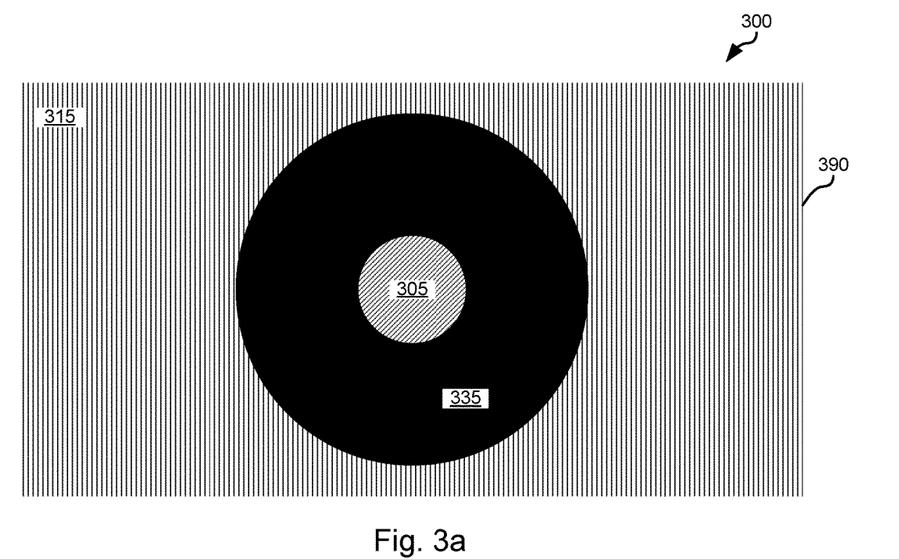
FIGS. 3a-3d show a portion of a display including a well into which a post enhanced diode can be deposited in accordance with some embodiments of the present inventions.
Figure 3B:
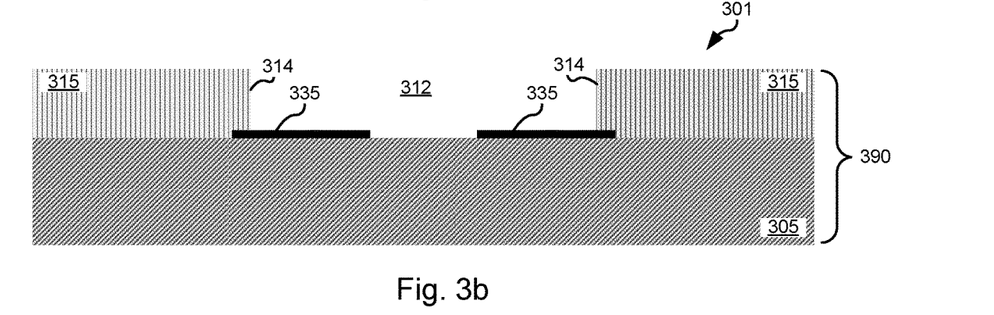

Turning to FIGS. 3a-3b, a top view 300 and a cross sectional view 301 of a portion of a display including a well 312 into which a post enhanced diode 210 can be deposited is depicted in accordance with some embodiments of the present inventions. As shown, the display includes a substrate 390 composed of a polymer material 315 laminated to the surface of a glass substrate 305. It should be noted that materials other than glass may be used in place of glass substrate. Additionally, other conductive or non-conductive layers may exist between materials 315 and 305. Further, it should be noted that in some cases polymer material 315 may be replaced by glass or another suitable material. In some embodiments, substrate 315 is made by forming an electric contact layer on the surface of glass substrate 305, and etching the electric contact layer to yield an electrical contact 335 at a location corresponding to a future well. It should be noted that while electrical contact 335 is shown as a donut shape, that it may be a solid circle shape as there is not a through hole via or another suitable shape for forming an electrical contact in the bottom of a well. Polymer material 315 is then laminated over glass substrate 305 and electrical contact 335, followed by an etch of polymer material 315 to open well 312 defined by a sidewall 314 and expose a portion of electrical contact 335. Electrical contact 335 may be formed of any material capable of forming an electrical junction with bottom surface 275 of a post enhanced diode 210. In some cases, electrical contact 335 is formed of a metal that when annealed with a post enhanced diode 210 disposed within well 312 forms an electrically conductive location between a signal connected to electrical contact 335 and electrically conductive material 270 of a post enhanced diode 210. In some embodiments, the depth of well 312 is substantially equal to the height of the diode portion (Hd) of a post enhanced diode 210 such that only one post enhanced diode 210 deposits in well 312.

During fluidic assembly a liquid flow (indicated by arrows 360) results in drag forces on post enhanced diodes 210 traversing the surface of substrate 390. Because post enhanced diodes 210 include a post 255 extending from the diode structure, the drag forces have an asymmetric impact on the orientation of the plate diodes. In particular, the drag forces result in a positive moment of force about a fixed point of rotation (e.g., an edge of the diode structure in contact with the surface of substrate 390) that will flip an inverted post enhanced diode 210 into a non-inverted orientation. In contrast, the drag forces on a non-inverted post enhanced diode 210 due to the liquid flow are primarily due to perturbations around post 255, and the forces exerted on the diode structure of a post enhanced diode 210 lead to a negative net moment of force. This negative net moment of force the leading edge (i.e., the edge leading in the direction of arrows 360) of the diode structure down and stabilizes the post enhanced diode 210 in the non-inverted orientation.

Figure 3C:
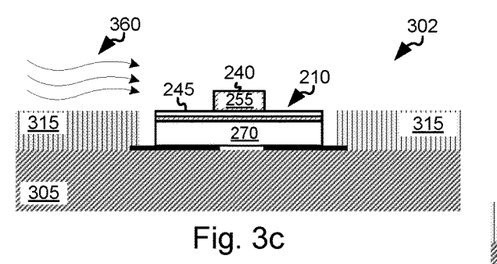
Figure 3D:
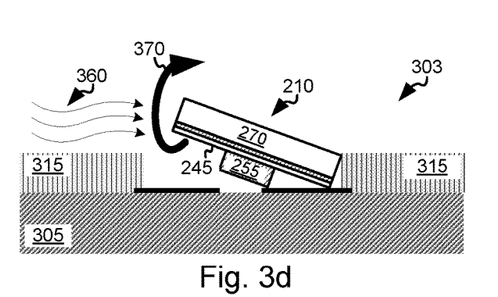

A similar asymmetric impact of the drag forces occurs between a post enhanced diode 210 deposited in a non-inverted orientation in well 312 (shown in a cross sectional view 302 of FIG. 3c), and a post enhanced diode 210 deposited in an inverted orientation in well 312 (shown in a cross sectional view 303 of FIG. 3d). As shown in FIG. 3c, any moment of force around the lower right corner of post enhanced diode 210 caused by the liquid flow is offset by forces exerted on top surface 245 of post enhanced diode 210 resulting in a negative net moment of force tending to maintain post enhanced diode 210 deposited in well 210. As shown in FIG. 3d, when post enhanced diode 210 is inverted in well 312 top surface 245 acts a hydrofoil generating a lifting force from the liquid flow such that a net positive moment of force results around the right side of post enhanced diode 210 contacting side 314 of well 312. This net positive moment of force tends to cause post enhanced diode 210 to flip in a direction indicated by an arrow 370 such that post enhanced diode 210 is forced out of well 312 and possibly into a non-inverted orientation as the liquid flow moves post enhanced diode 210 toward another downstream well where it may re-deposit.

Figure 4A:
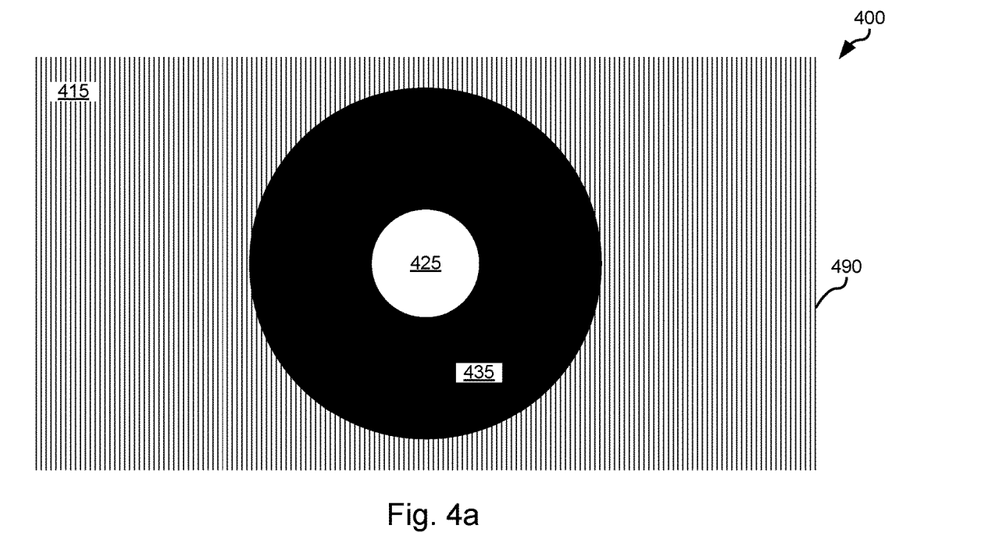
FIGS. 4a-4d show a portion of a display including a through hole via well into which a post enhanced diode can be deposited in accordance with other embodiments of the present inventions.
Figure 4B:
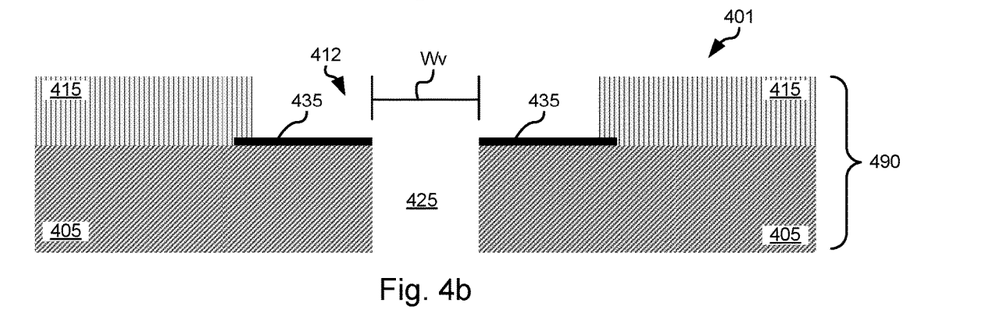

Turning to FIGS. 4a-4b, a top view 400 and a cross sectional view 401 of a portion of a display including a through hole via well 412 into which a post enhanced diode 210 can be deposited is depicted in accordance with some embodiments of the present inventions. As shown, the display includes a substrate 490 composed of a polymer material 415 laminated to the surface of a glass substrate 405. Additionally, other conductive or non-conductive layers may exist between materials 415 and 405. It should be noted that materials other than glass may be used in place of glass substrate. Further, it should be noted that in some cases polymer material 415 may be replaced by glass or another suitable material. In some embodiments, substrate 415 is made by forming an electric contact layer on the surface of glass substrate 405, and etching the electric contact layer to yield an electrical contact 435 at a location corresponding to a future well. Polymer material 415 is then laminated over glass substrate 405 and electrical contact 435, followed by an etch of polymer material 415 to open well 412 and expose a portion of electrical contact 435. Electrical contact 435 may be formed of any material capable of forming an electrical junction with bottom surface 275 of a post enhanced diode 210. In some cases, electrical contact 435 is formed of a metal that when annealed with a post enhanced diode 210 disposed within well 412 forms an electrically conductive location between a signal connected to electrical contact 435 and electrically conductive material 270 of a post enhanced diode 210. In some embodiments, the depth of well 412 is substantially equal to the height of the diode portion (Hd) of a post enhanced diode 210 such that only one post enhanced diode 210 deposits in well 412.

An additional process is performed to form a through hole via 425 extending through glass substrate 405. In some cases, the width of through hole via 425 (Wv) is less than a minimum width of post 255 to assure that post 255 does not insert into through hole via 425 when post enhanced diode 210 is inverted in well 412 as such insertion would limit the ability for post enhanced diode 210 to flip out of well 412. In other cases, through hole via 425 is substantially centered in well 512 and post 255 is considerably off-center on top surface 425 of the diode structure, or through hole via 425 is considerably off-center in the base of well 512 and post 255 is substantially centered on top surface 425 of the diode structure such that when a post enhanced diode 210 deposits in well 512 in an inverted orientation post 255 does not align with through hole via 425.

During fluidic assembly a liquid flow (indicated by arrows 460) results in drag forces on post enhanced diodes 210 traversing the surface of substrate 490. Because post enhanced diodes 210 include a post 255 extending from the diode structure, the drag forces have an asymmetric impact on the orientation of the plate diodes. In particular, the drag forces result in a positive moment of force about a fixed point of rotation (e.g., an edge of the diode structure in contact with the surface of substrate 490) that will flip an inverted post enhanced diode 210 into a non-inverted orientation. In contrast, the drag forces on a non-inverted post enhanced diode 210 due to the liquid flow are primarily due to perturbations around post 255, and the forces exerted on the diode structure of a post enhanced diode 210 lead to a negative net moment of force. This negative net moment of force the leading edge (i.e., the edge leading in the direction of arrows 460) of the diode structure down and stabilizes the post enhanced diode 210 in the non-inverted orientation.

Figure 4C:
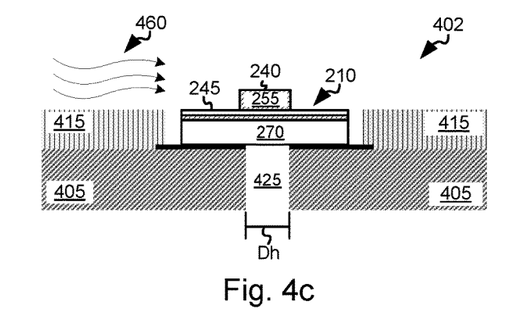
Figure 4D:
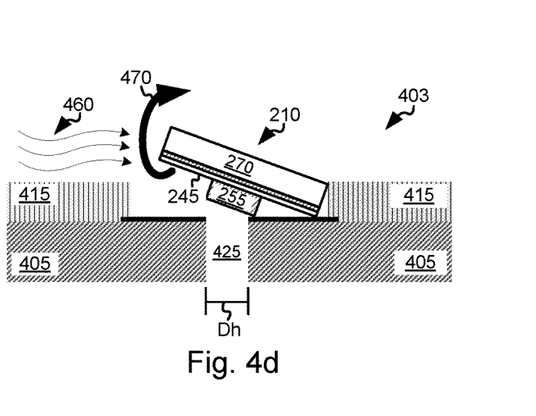

A similar asymmetric impact of the drag forces occurs between a post enhanced diode 210 deposited in a non-inverted orientation in well 412 (shown in a cross sectional view 402 of FIG. 4c), and a post enhanced diode 210 deposited in an inverted orientation in well 412 (shown in a cross sectional view 403 of FIG. 4d). As shown in FIG. 4c, any moment of force around the lower right corner of post enhanced diode 210 caused by the liquid flow is offset by forces exerted on top surface 245 of post enhanced diode 210 resulting in a negative net moment of force tending to maintain post enhanced diode 210 deposited in well 210. As shown in FIG. 4d, when post enhanced diode 210 is inverted in well 412 top surface 245 acts a hydrofoil generating a lifting force from the liquid flow such that a net positive moment of force results around the right side of post enhanced diode 210 contacting a side of well 412. This net positive moment of force tends to cause post enhanced diode 210 to flip in a direction indicated by an arrow 470 such that post enhanced diode 210 is forced out of well 412 and possibly into a non-inverted orientation as the liquid flow moves post enhanced diode 210 toward another downstream well where it may re-deposit.

Additionally, a suction may be applied to the bottom side of substrate 490. When post enhanced diode 210 deposits in well 412 in a non-inverted orientation such as that shown in cross sectional view 402, the applied suction force further stabilizes post enhanced diode 210 in well 412. It should be noted that the applied suction also provides some stabilization of a post enhanced diode 210 deposited in well 412 in an inverted orientation, but the stabilization due to the suction on a non-inverted post enhanced diode 210 is substantially greater than that on an inverted post enhanced diode 210. Such suction allows for increased assembly speed. Additionally, at the end of fluidic assembly after depositing or placing post enhanced diodes in a number of wells, a clean up process is performed to remove any excess post enhanced diodes. The addition of the suction force allows for a more aggressive clean up operation including, for example, flowing a cleaning fluid over the surface of substrate 490 at a much higher rate than that used during the deposition process without disturbing the deposited post enhanced diodes 210 held in place in part by the added suction force.

Figure 5A:
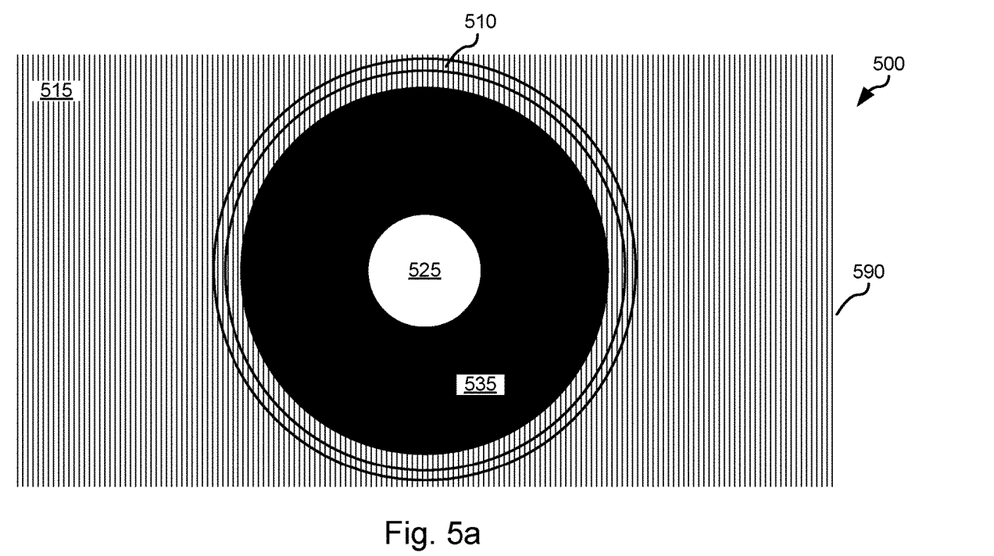
FIGS. 5a-5d show a portion of a display including a concentric grooved well into which a post enhanced diode can be deposited in accordance with one or more embodiments of the present inventions.
Figure 5B:
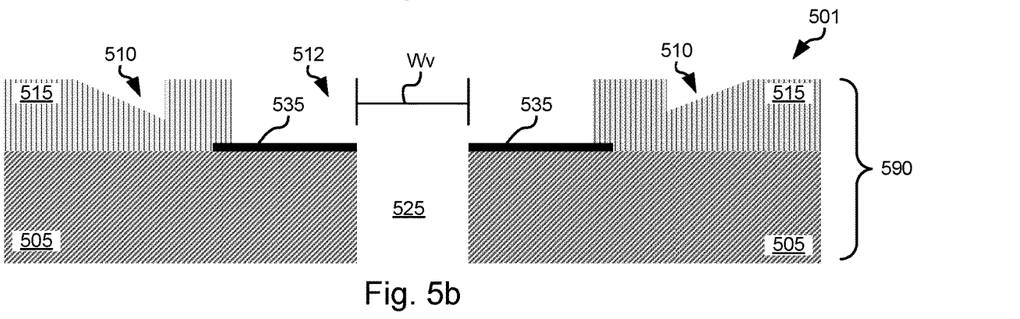

Turning to FIGS. 5a-5b, a top view 500 and a cross sectional view 501 of a portion of a display including a through hole via well 512 into which a post enhanced diode 210 can be deposited is depicted in accordance with some embodiments of the present inventions. As shown, the display includes a substrate 590 composed of a polymer material 515 laminated to the surface of a glass substrate 505. It should be noted that materials other than glass may be used in place of glass substrate. Additionally, other conductive or non-conductive layers may exist between materials 515 and 505. Further, it should be noted that in some cases polymer material 515 may be replaced by glass or another suitable material. In some embodiments, substrate 515 is made by forming an electric contact layer on the surface of glass substrate 505, and etching the electric contact layer to yield an electrical contact 535 at a location corresponding to a future well. Polymer material 515 is then laminated over glass substrate 505 and electrical contact 535, followed by an etch of polymer material 515 to open well 512 and expose a portion of electrical contact 535. Electrical contact 535 may be formed of any material capable of forming an electrical junction with bottom surface 275 of a post enhanced diode 210. In some cases, electrical contact 535 is formed of a metal that when annealed with a post enhanced diode 210 disposed within well 512 forms an electrically conductive location between a signal connected to electrical contact 535 and electrically conductive material 270 of a post enhanced diode 210. In some embodiments, the depth of well 512 is substantially equal to the height of the diode portion (Hd) of a post enhanced diode 210 such that only one post enhanced diode 210 deposits in well 512.

An additional process is performed to form a through hole via 525 extending through glass substrate 505. In some cases, the width of through hole via 525 (Wv) is less than a minimum width of post 255 to assure that post 255 does not insert into through hole via 525 when post enhanced diode 210 is inverted in well 512 as such insertion would limit the ability for post enhanced diode 210 to flip out of well 512. In other cases, through hole via 525 is substantially centered in well 512 and post 255 is considerably off-center on top surface 525 of the diode structure, or through hole via 525 is considerably off-center in the base of well 512 and post 255 is substantially centered on top surface 525 of the diode structure such that when a post enhanced diode 210 deposits in well 512 in an inverted orientation post 255 does not align with through hole via 525.

Figure 5C:
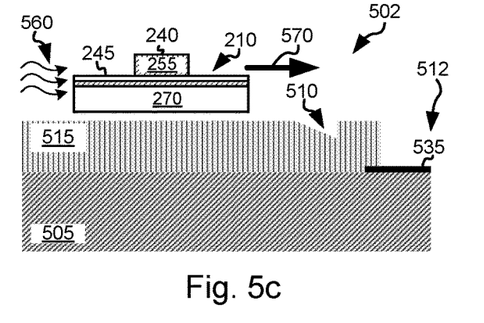
Figure 5D:
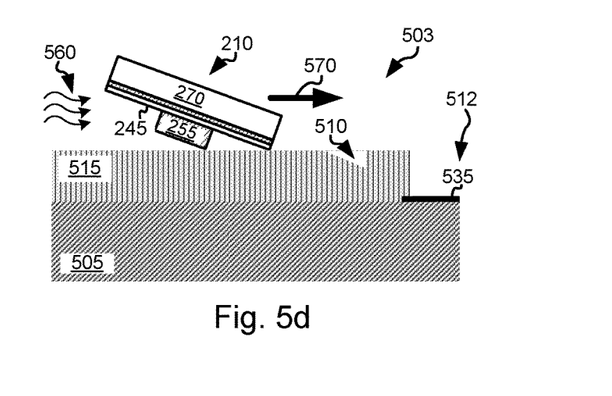

Further, substrate 590 is etched to form a groove 510 concentrically around well 512. As shown, in some embodiments groove 510 exhibits one substantially vertical side wall and one highly tapered side wall. The tapered side wall is less likely to catch a leading edge of post enhanced diode 210 traversing the surface of substrate 590 in either a non-inverted orientation (shown in a cross sectional view 502 of FIG. 5c) or an inverted orientation (shown in a cross sectional view 503 of FIG. 5c) in a direction indicated by an arrow 570. As the edge catches, a moment of force develops around the edge inducing post enhanced diode 210 to flip. In contrast, a more vertical side wall on groove 510 is more likely to catch a leading edge of post enhanced diode 210 traversing the surface of substrate 590 in an inverted orientation (shown in cross sectional view 503 of FIG. 5c), but unlikely to catch the leading edge of post enhanced diode 210 traversing in a non-inverted orientation (shown in cross sectional view 502 of FIG. 5c). To limit the ability for groove 510 to catch the leading edge of post enhanced diode 210 traversing in a non-inverted orientation (shown in cross sectional view 502 of FIG. 5c), the width of groove 510 is relatively small. In some embodiments, the width of groove is less than twenty-five percent of the width of the diode structure (Wd). Groove 510 should be designed such that it is large enough to catch a leading edge of an inverted post enhanced diode 210, but small enough to let a non-inverted post enhanced diode 210 pass without catching a leading edge. As further guidance to avoiding catching a leading edge of a non-inverted post enhanced diode 210, groove 510 should be flush with the surface of substrate 590.

It should be noted that other shapes for groove 510 are possible in accordance with other embodiments of the present invention. For example, groove 510 may include two substantially vertical walls with each wall about equal in catching a leading edge of a post enhanced diode 210 traversing the surface of substrate 590 in an inverted orientation. Thus, regardless of the direction that a post enhanced diode 210 is traversing the surface of substrate 590, it is equally likely to catch and flip. In such cases, it may be desirable to make the width of groove 510 less than the width of post 255 to avoid the possibility of post 255 inserting into groove 510 and becoming trapped.

During fluidic assembly a liquid flow (indicated by arrows 560) results in drag forces on post enhanced diodes 210 traversing the surface of substrate 590. Because post enhanced diodes 210 include a post 255 extending from the diode structure, the drag forces have an asymmetric impact on the orientation of the plate diodes. In particular, the drag forces result in a positive moment of force about a fixed point of rotation (e.g., an edge of the diode structure in contact with the surface of substrate 590) that will flip an inverted post enhanced diode 210 into a non-inverted orientation. In contrast, the drag forces on a non-inverted post enhanced diode 210 due to the liquid flow are primarily due to perturbations around post 255, and the forces exerted on the diode structure of a post enhanced diode 210 lead to a negative net moment of force. This negative net moment of force about the leading edge (i.e., the edge leading in the direction of arrows 560) of the diode structure holds the diode structure down and stabilizes the post enhanced diode 210 in the non-inverted orientation.

In some cases, the drag forces on an inverted post enhanced diode 210 traversing the surface of substrate 590 are insufficient to cause a change in orientation. This may be in part due to the difference between the rate at which the carrier fluid is flowing and the rate at which the inverted post enhanced diode 210 is moving is insufficient. However, when a leading edge of an inverted post enhanced diode 210 catches in groove 510, the relative rate at which the carrier fluid is flowing and the rate at which the inverted post enhanced diode 210 is moving increases. This increase in the relative velocity results in a corresponding increase in drag forces and likelihood of flipping. As groove 510 is less likely to catch a leading edge of a non-inverted post enhanced diode 210, the impact of the groove on non-inverted post enhanced diodes 210 is insubstantial.

Figure 6A:
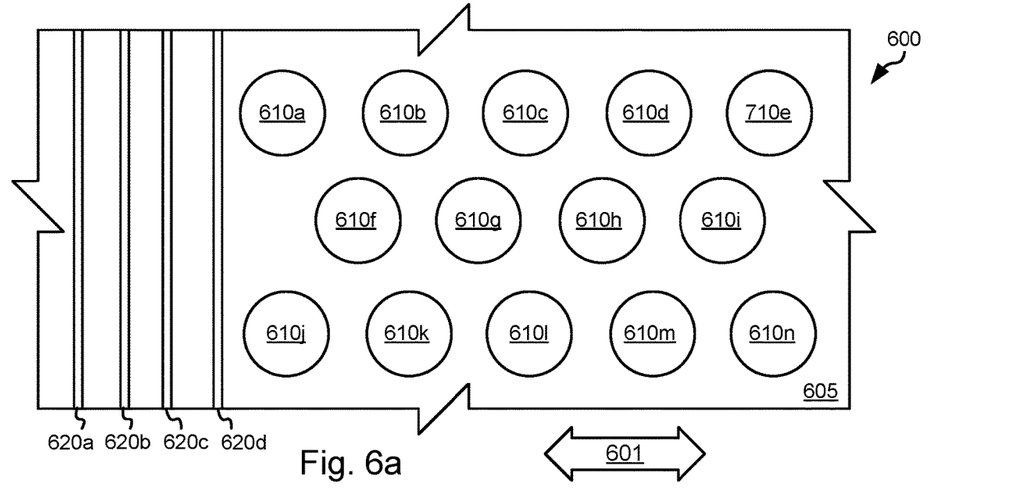
FIGS. 6a-6b are top views of alternate groove patterns in accordance with other embodiments of the present inventions.
Figure 6B:
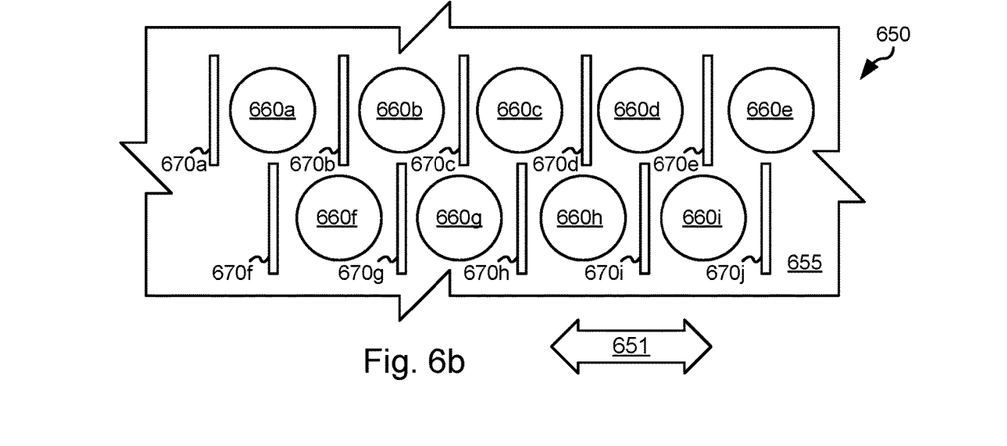

While the preceding embodiment disclosed a groove concentric around a well, other locations and geometries for a groove may be used in accordance with different embodiments. For example, FIG. 6a shows a top view 600 of a substrate portion 605 including a number of wells 610 into which post enhanced diodes 210 may be deposited. In addition, a number of parallel grooves 620 are formed in the surface of substrate portion 605 such that the direction of flow (shown by an arrow 601) is generally perpendicular to grooves 620. In this configuration, grooves 620 perturb the orientation of inverted post enhanced diodes 210 traversing substrate portion 605 similar to that discussed above in relation to FIG. 5. As another example, FIG. 6b shows a top view 650 of a substrate portion 655 including a number of wells 660 into which post enhanced diodes 210 may be deposited. In addition, a number of parallel grooves 670 are formed in the surface of substrate portion 655 such that the direction of flow (shown by an arrow 651) is generally perpendicular to grooves 670. In this configuration, grooves 670 perturb the orientation of inverted post enhanced diodes 210 traversing substrate portion 655 similar to that discussed above in relation to FIG. 5.

Figure 7:
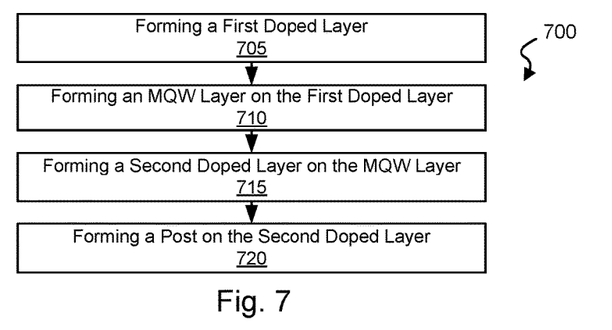
FIG. 7 is a flow diagram depicting a method for forming a post enhanced diode in accordance with some embodiments of the present inventions.

Turning to FIG. 7, a flow diagram 700 depicts a method for forming a post enhanced diode in accordance with some embodiments of the present inventions. Following flow diagram 700, a first doped layer is formed (block 705). The first doped layer is formed by doping a semiconductor material with a first dopant type which is either a p-type dopant or an n-type dopant. Any process known in the art for forming a doped material may be used. In some embodiments, the first doped layer is an n-doped GaN layer.

An MQW layer is formed on the first doped layer (block 710). Any process known in the art for forming an MQW layer may be used. A second doped layer is formed on top of the MQW layer (block 715). The second doped layer is formed by doping a semiconductor material with a second dopant type which is the opposite doping of the first dopant type. Any process known in the art for forming a doped material may be used. In some embodiments where the first doped layer is an n-doped GaN layer, the second doped layer is a p-doped GaN layer.

A post is formed on the second doped layer (block 720). Various approaches may be used for forming a post extending from the second doped layer. For example, fabricating a homogeneous post may be done as part of the second doped layer where a semiconductor material is formed on the MQW layer, and then etched back leaving a thick post structure and a thinner layer of the semiconductor extending from the edges of the post to the edges of the MQW layer. In this case, the second doped layer may be doped after the post is formed. As another example, the post may be formed on the second doped layer after the second doped layer has been doped through selective epitaxial growth using the same material to as the second doped layer. As other examples, forming a heterogeneous post may include etching the post from a film that is deposited onto the second doped layer, or by forming a post with a different material through plating or a templated growth process on top the second doped layer. This latter approach permits the use of any material for the post (e.g., dielectrics, metals, etc.). In some cases, photolithography of a photo resist may be used in relation to the aforementioned plating or template growth. While not shown in flow diagram 700, individual post enhanced diodes can then be cut by etching through the combination of the second doped material, the MQW layer, and the first doped material to yield individual post enhanced diodes similar to those discussed above in relation to FIGS. 2b-2e.

Figure 8:
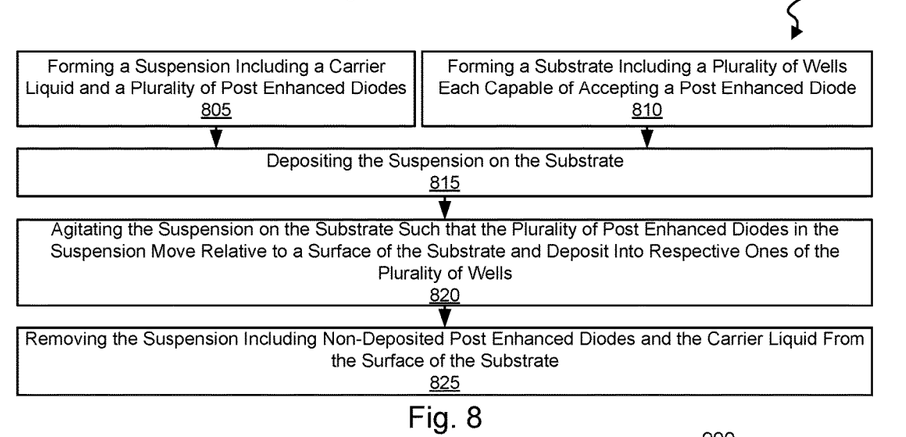
FIGS. 8-9 are flow diagrams showing methods for depositing or placing post enhanced diodes into substrate wells in accordance with various embodiments of the present inventions.

Turning to FIG. 8, a flow diagram 800 shows a method for depositing or placing post enhanced diodes into substrate wells in accordance with various embodiments of the present inventions. Following flow diagram 800, a substrate is formed including a plurality of wells each capable of accepting a post enhanced diode (block 810). The substrate may be formed similar to that discussed above in relation to any of FIGS. 3-5. In addition, a suspension is formed by adding a plurality of post enhanced diodes to a carrier liquid (block 805). In some cases, the carrier liquid is isopropanol, but may be another liquid or gas capable of moving post enhanced diodes across the surface of a substrate.

The suspension is deposited on a surface of the substrate that includes the wells (block 815). This deposit may be done by any suitable method including, but not limited to, pumping the suspension or draining the suspension onto the surface. The suspension is then agitated on the substrate such that the plurality of post enhanced diodes in the suspension move relative to the surface of the substrate and deposit into respective ones of the plurality of wells (block 820). Because of the asymmetry of force due to the post extending from a top surface of a diode structure, the post enhanced diodes tend to assume a non-inverted orientation when exposed to movement of the carrier liquid. The suspension including non-deposited post enhanced diodes and the carrier liquid is removed from the surface of the substrate in a clean-up process (block 825).

Figure 9:
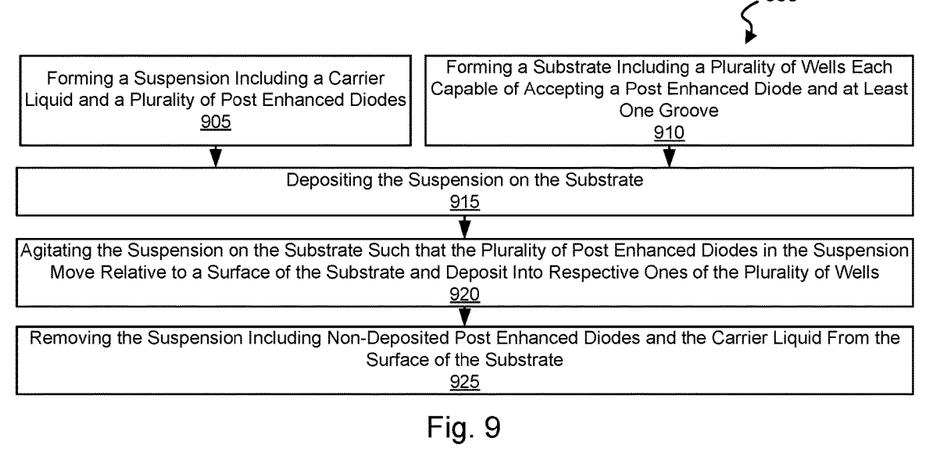

Turning to FIG. 9, a flow diagram 900 shows another method for depositing or placing post enhanced diodes into substrate wells in accordance with various embodiments of the present inventions. Following flow diagram 900, a substrate is formed including a plurality of wells each capable of accepting a post enhanced diode and at least one groove capable of catching a leading edge of an inverted post enhanced diode traversing the surface of the substrate (block 810). The substrate may be formed similar to that discussed above in relation to any of FIGS. 3-5, and include a groove pattern similar to that discussed above in relation to FIGS. 5-6. In addition, a suspension is formed by adding a plurality of post enhanced diodes to a carrier liquid (block 805). In some cases, the carrier liquid is isopropanol, but may be another liquid or gas capable of moving post enhanced diodes across the surface of a substrate.

The suspension is deposited on a surface of the substrate that includes the wells (block 915). This deposit may be done by any suitable method including, but not limited to, pumping the suspension or draining the suspension onto the surface. The suspension is then agitated on the substrate such that the plurality of post enhanced diodes in the suspension move relative to the surface of the substrate and deposit into respective ones of the plurality of wells (block 920). Because of the asymmetry of force due to the post extending from a top surface of a diode structure, the post enhanced diodes tend to assume a non-inverted orientation when exposed to movement of the carrier liquid. Further, because of the possibility of inverted post enhanced diodes catching a leading edge in the groove on the surface of the substrate as they move across the substrate, the tendency of the post enhanced diodes to assume a non-inverted orientation when exposed to movement of the carrier liquid is increased. The suspension including non-deposited post enhanced diodes and the carrier liquid is removed from the surface of the substrate in a clean-up process (block 925).

One of ordinary skill in the art will recognize various advantages achievable through use of different embodiments of the inventions. As just some of many advantages, lower display costs are possible as a significant cost of manufacturing a microLED display is the material cost of the microLEDs themselves. As some embodiments of the present inventions allow for reducing redundancy otherwise necessary to assure an operable display, the overall number of microLEDs may be reduced resulting in a corresponding reduction in costs. Various embodiments of the present inventions do not require lock-n-key type interaction between post enhanced diodes and wells which allow diodes to deposit in only a single orientation. As such, manufacturing tolerances may be reduced leading to greater yields and/or lower costs. Based upon the disclosure provided herein, one of ordinary skill in the art will recognize a variety of other advantages achievable through use of one or more embodiments of the present inventions.

In conclusion, the invention provides novel systems, devices, methods and arrangements for fluidic assembly. While detailed descriptions of one or more embodiments of the invention have been given above, various alternatives, modifications, and equivalents will be apparent to those skilled in the art without varying from the spirit of the invention. For examples, while some embodiments are discussed in relation to displays, it is noted that the embodiments find applicability to devices other than displays. Therefore, the above description should not be taken as limiting the scope of the invention, which is defined by the appended claims.

What is claimed is:

1. A method for assembling a display device, the method comprising:
   providing a substrate, wherein the substrate includes at least one groove extending blow a top surface of the substrate;
   providing a suspension including a carrier liquid and a plurality of post enhanced diodes, wherein each of the post enhanced diodes includes a post extending from a top surface of a diode structure; and
   orienting the plurality of post enhanced diodes in relation to the top surface of the substrate by flowing the suspension over the at least one groove in the top surface of the substrate, wherein an orientation of a post enhanced diode where the post extends away from the substrate is a more likely non-inverted orientation, and wherein an orientation of each of a post enhanced diode where the post extends toward the substrate is a less likely inverted orientation.

2. The method of claim 1, wherein the at least one groove is configured such that a post enhanced diode carried in the suspension across the at least one groove in the surface of the substrate in the non-inverted orientation is more mechanically stable than the post enhanced diode carried in the suspension across the at least one groove in the surface of the substrate in the inverted orientation.

3. The method of claim 1, wherein the post is a non-metallic post.

4. The method of claim 1, wherein the post is a metallic post.

5. The method of claim 1, wherein the post is selected from a group consisting of: a non-conductive post, and a conductive post.

6. The method of claim 1, wherein the substrate further includes a plurality of wells extending below the top surface of the substrate, wherein each of the plurality of wells is configured to accept a post enhanced diode, the method further comprising:
   flowing the suspension over the top surface of the substrate such that each of the of the plurality of wells is filled with a respective one of the plurality of post enhanced diodes in the non-inverted orientation.

7. The method of claim 6, wherein at least one sidewall of a line extending into the substrate is tapered.

8. The method of claim 1, wherein the at least one groove extends in a line across a portion of the substrate, and wherein the line is selected from a group consisting of: a straight line, and a curvilinear line.

9. The method of claim 8, wherein at least one sidewall of the line extending into the substrate is substantially vertical.

10. A method for assembling a display device, the method comprising:
    providing a substrate, wherein the substrate includes a plurality of wells extending into a top surface of the substrate, wherein each of the plurality of wells is configured to accept a post enhanced diode;
    providing a suspension including a carrier liquid and a plurality of post enhanced diodes, wherein each of the plurality of the post enhanced diodes includes a post extending from a top surface of a diode structure; and
    orienting the plurality of post enhanced diodes in relation to the top surface of the substrate by flowing the suspension over the plurality of wells, wherein an orientation of a post enhanced diode where the post extends away from the substrate is a non-inverted orientation, wherein an orientation of each of a post enhanced diode where the post extends toward the substrate is an inverted orientation, wherein one of the plurality of post enhanced diodes deposited in a respective one of the plurality of wells is more mechanically stable in the non-inverted orientation than in the inverted orientation.

11. The method of claim 10, wherein the substrate further includes at least one groove extending into the top surface of the substrate, the method further comprising:
    flowing the suspension over the at least one groove in the top surface of the substrate, wherein flowing past the at least one groove makes the non-inverted orientation more likely than the inverted orientation.

12. The method of claim 11, wherein the at least one groove is configured such that a post enhanced diode carried in the suspension across the at least one groove in the surface of the substrate in the non-inverted orientation is more mechanically stable than the post enhanced diode carried in the suspension across the at least one groove in the surface of the substrate in the inverted orientation.

13. The method of claim 11, wherein the at least one groove extends in a line across a portion of the substrate, and wherein the line is selected from a group consisting of: a straight line, and a curvilinear line.

14. The method of claim 13, wherein at least one sidewall of the line extending into the substrate is tapered.

15. The method of claim 13, wherein at least one sidewall of the line extending into the substrate is substantially vertical.

16. The method of claim 10, wherein the post is a non-metallic post.

17. The method of claim 10, wherein the post is a metallic post.

18. The method of claim 10, wherein the post is a non-conductive post.

19. The method of claim 10, wherein the post is a conductive post.

20. The method of claim 10, the method further comprising:
   flowing the suspension over the top surface of the substrate such that each of the of the plurality of wells is filled with a respective one of the plurality of post enhanced diodes in the non-inverted orientation.

* * * * *